United States Patent
Hsieh et al.

(10) Patent No.: US 8,650,329 B2
(45) Date of Patent: Feb. 11, 2014

(54) ELECTRONIC DEVICE AND PORT REDUCING METHOD

(75) Inventors: Po-Chuan Hsieh, New Taipei (TW); Chun-Neng Liao, New Taipei (TW); Shin-Ting Yen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/564,734

(22) Filed: Aug. 2, 2012

(65) Prior Publication Data
US 2013/0151732 A1    Jun. 13, 2013

(30) Foreign Application Priority Data
Dec. 7, 2011   (TW) .............................. 100145063 A

(51) Int. Cl.
*G06F 3/00* (2006.01)
*G01V 1/40* (2006.01)

(52) U.S. Cl.
USPC .............................................. 710/5; 702/107

(58) Field of Classification Search
None
See application file for complete search history.

(56) References Cited

U.S. PATENT DOCUMENTS

| | | | | |
|---|---|---|---|---|
| 2008/0191712 A1* | 8/2008 | Eisenstadt et al. | ............ | 324/638 |
| 2009/0184721 A1* | 7/2009 | Albert-Lebrun et al. | ..... | 324/601 |
| 2009/0195498 A1* | 8/2009 | Karapattu et al. | ............ | 345/156 |
| 2012/0109566 A1* | 5/2012 | Adamian | ...................... | 702/107 |
| 2012/0242410 A1* | 9/2012 | Darwish et al. | ............... | 330/288 |

* cited by examiner

*Primary Examiner* — Hyun Nam
(74) *Attorney, Agent, or Firm* — Altis Law Group, Inc.

(57) ABSTRACT

An exemplary port reducing method is for removing unselected ports of an original S-parameter file and generating an optimized S-parameter file. The method controls a display unit to display a user interface to receive commands from a user in response to user operation; the commands comprise a calling command, a selecting command, and an executing command. The method obtains the original S-parameter file in response to the calling command. Next, the method determines which of the ports of the original S-parameter file are unselected in response to the selecting command, and connects each unselected port to the ground through one terminal impedance. The method then generates an optimized S-parameter file that comprises only the selected ports in response to the executing command.

16 Claims, 6 Drawing Sheets

ELECTRONIC DEVICE AND PORT REDUCING METHOD

BACKGROUND

1. Technical Field

The present disclosure relates to electronic devices, and particularly, to an electronic device capable of reducing the undesired ports of an S-parameter file and a port reducing method.

2. Description of Related Art

An S-parameter file is generated in circuit simulation. The S-parameter file may be burdened with a large number of input/output (I/O) ports. Only a certain number of the ports of the S-parameter file are actually needed. However, in the simulation design, all the ports of the S-parameter file are simulated, which may cause the simulation operation to require a large amount of computation and thus an excessive amount of time to complete the computation. Therefore, a method to decrease the number of simulated ports of the S-parameter file is desired in order to resolve the above problem.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

The embodiments of the present disclosure are described with reference to the accompanying drawings.

Figure 1:
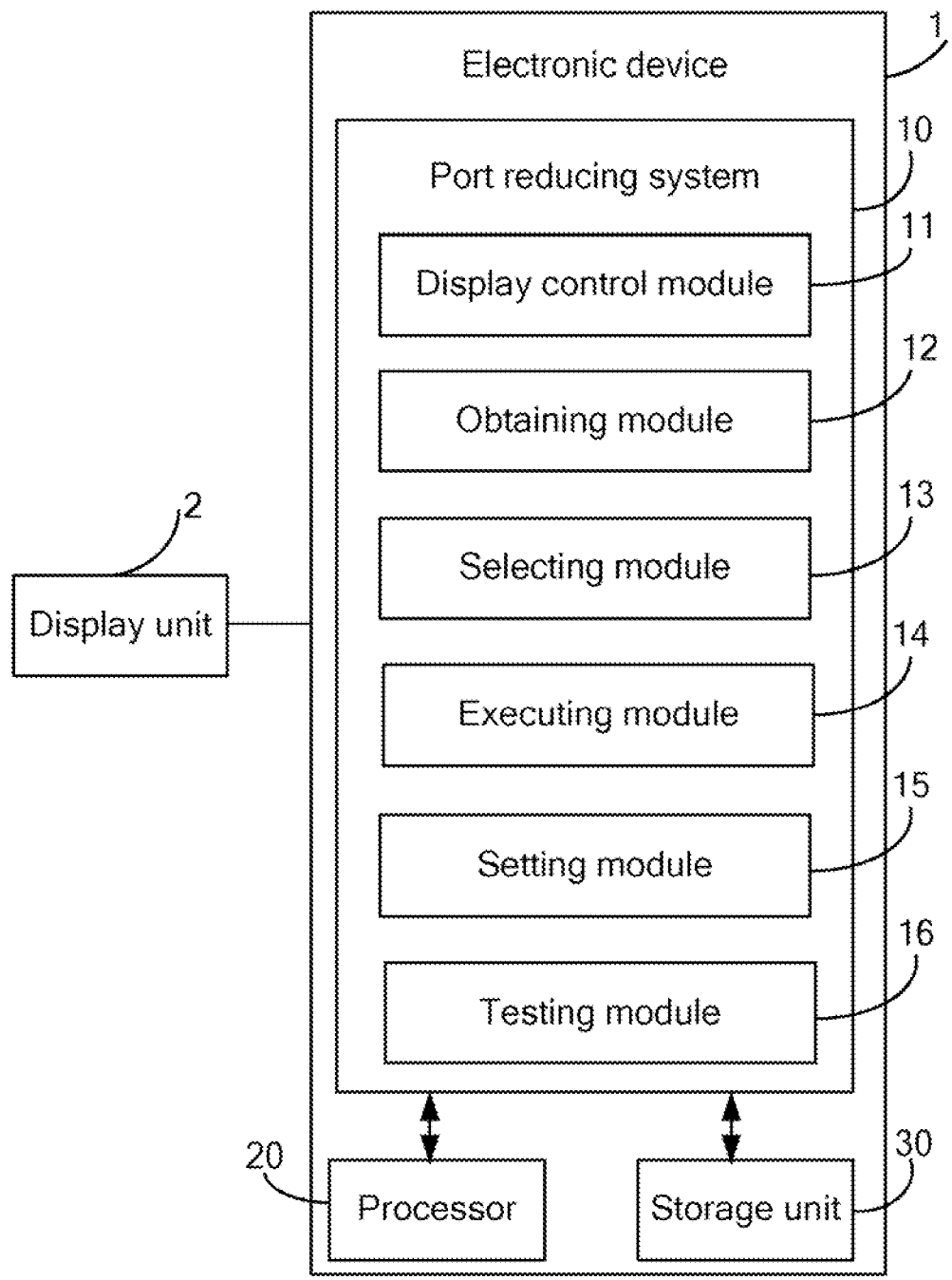
FIG. 1 is a schematic diagram illustrating an electronic device in accordance with an exemplary embodiment.

FIG. 1 shows a schematic block diagram illustrating an electronic device 1 that can reduce the undesired number of ports of an S-parameter file in the circuit simulation design. The electronic device 1 can determine which of the ports of an original S-parameter file are undesired in response to user operation, and generate an optimized S-parameter file with the undesired ports removed. The electronic device 1 is connected to a display unit 2. The electronic device 1 includes a port reducing system 10, a processor 20, and a storage unit 30.

In the embodiment, the port reducing system 10 includes a display control module 11, an obtaining module 12, a selecting module 13, and an executing module 14. One or more program modules of the above function modules may be stored in the storage unit 30 and executed by the processor 20. In general, the word "module," as used herein, refers to logic embodied in hardware or firmware, or to a collection of software instructions, written in a programming language. The software instructions in the modules may be embedded in firmware, such as in an erasable programmable read-only memory (EPROM) device. The modules described herein may be implemented as either software and/or hardware modules and may be stored in any type of non-transitory computer-readable medium or other storage unit. In the embodiment, the storage unit 30 further stores at least one S-parameter file.

The display control module 11 is to control the display unit to display a user interface 100 for receiving commands inputted by a user in response to user operation. The commands include a calling command, a selecting command, and an executing command. The operation whereby the user inputs a stored path of an original S-parameter file is considered as the calling command. The operation whereby the user selects a number of ports of the original S-parameter file as being the desired ports is considered as the selecting command. The operation whereby the user clicks the executing function is considered as the executing command.

The obtaining module 12 is to obtain the original S-parameter file in response to the calling command.

The selecting module 13 is to determine the ports of the original S-parameter file which is not be selected as being the undesired ports of the original S-parameter file in response to the selecting command, and connect each undesired port to ground through one terminal impedance. In the embodiment, the selecting module 13 further highlights the ports which are desired in response to the selecting command, to inform the user that the highlighted ports have been selected.

The executing module 14 is to generate an optimized S-parameter file with the undesired ports removed from the original S-parameter file, in response to the executing command.

Figure 2A:
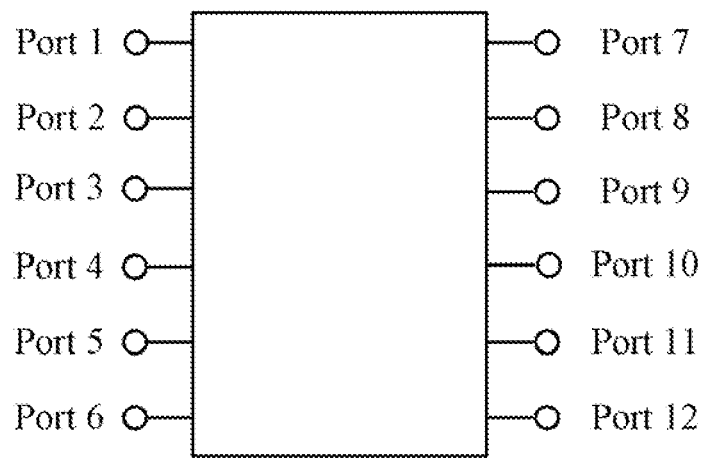
FIG. 2A is a schematic view showing an original S-parameter file.
Figure 2B:
FIG. 2B is a schematic view showing an optimized S-parameter file which is reduced from the original S-parameter file of FIG. 2A.
Figure 3A:
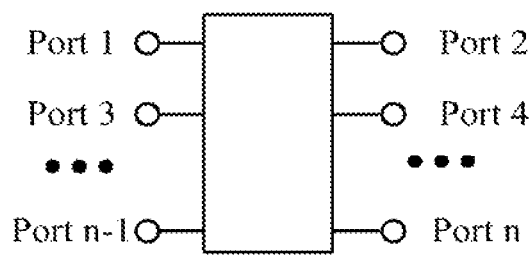
FIGS. 3A-3D are a series of schematic views showing the arrangement patterns of the original S-parameter file.
Figure 3B:
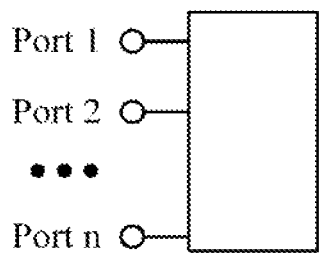
Figure 3C:
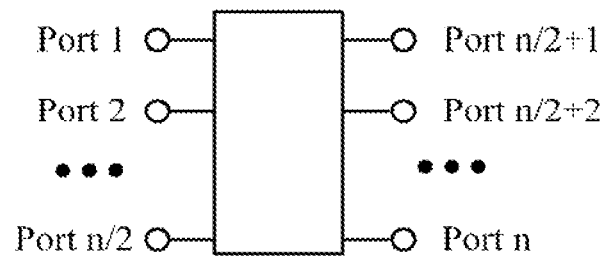
Figure 3D:
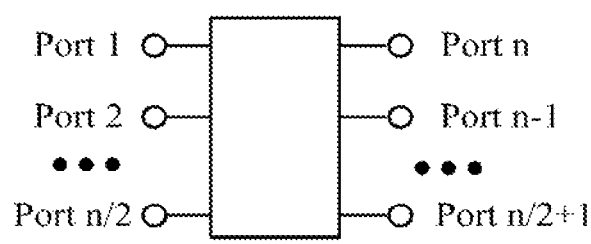

Referring to FIG. 2A, an original S-parameter file includes ports 1-12. When the ports 1-4 are selected by the user, the selecting module 13 connects each port of the unselected ports 5-12 to ground through one terminal impedance. The executing module 14 generates an optimized S-parameter file having only ports 1-4 as shown in FIG. 2B.

In the embodiment, the commands further include a terminal impedance command. The operation whereby the user inputs a resistance value of the terminal impedance is considered as the terminal impedance command The system 10 further includes a setting module 15. The setting module 15 is to set the resistance value of the terminal impedances connected to the unselected ports to the inputted resistance value in response to the terminal impedance command.

In the embodiment, the commands further include a ports arrangement pattern command The operation whereby the user selects a ports arrangement pattern is considered as the ports arrangement pattern command The setting module 15 further changes the ports arrangement pattern of the original S-parameter file to the selected ports arrangement pattern in response to the ports arrangement pattern command. Thus, the arrangement of the ports of the original S-parameter file is adjustable and a desired pattern can be selected, which is convenient for the user to input the selecting command Referring to FIGS. 3A-3D, the ports arrangement pattern may be odd-even, all-left, in sequence from up to down, and U-turn. In the odd-even ports arrangement pattern, the port numbers on the left are 1, 3, . . . , and n−1 (from top to bottom), the port numbers on the right 2, 4, . . . , and n (from top to bottom). In the all-left ports arrangement pattern, the port numbers on the left are 1, 2, . . . , and n (from up to down). In the in sequence from up to down ports arrangement pattern, the port numbers on the left are 1, 2, . . . , and n/2 (from up to down), the port numbers on the right are n/2+1, n/2+2, . . . , and n (from up to down). In the U-turn ports arrangement pattern, the port numbers on the left are 1, 2, . . . , and n/2 (from up to down), the port numbers on the right are n, n−1, . . . , and n/2+1 (from up to down). In the embodiment, the default ports arrangement pattern is the odd-even ports arrangement pattern.

Figure 4:
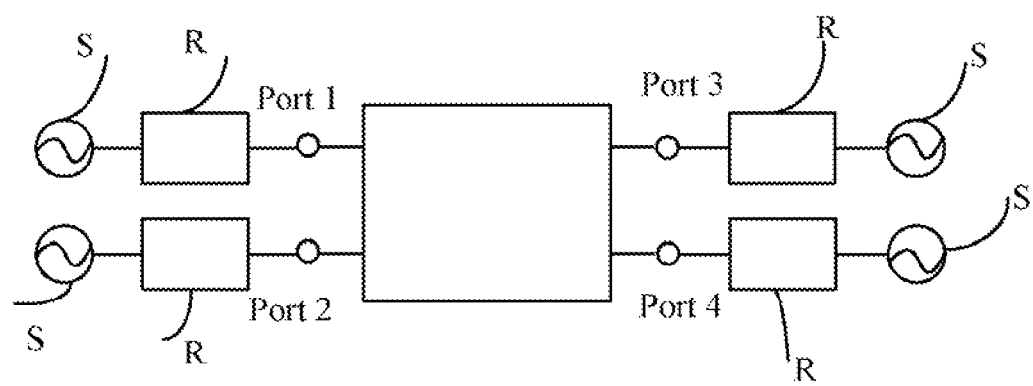
FIG. 4 is a schematic view showing how to test the ports of the S-parameter file.

In the embodiment, the commands further include a storing command. The operation whereby the user selects a target storage location is considered as the storing command. The executing module 14 is to determine the storage location of the optimized S-parameter file to be the target storage location in response to the storing command, and further stores the optimized S-parameter file in the target storage location in response to the executing command Referring to FIG. 4, in the embodiment, the selecting module 13 further connects each selected port of the S-parameter file to one power source through one port impedance in response to the selecting command. The commands further include a port impedance command and a testing command The operation whereby the user inputs the resistance value of the port impedance is considered as the port impedance command. The operation whereby the user clicks the testing function is considered as the testing command The system 10 further includes a testing module 16. The setting module 15 is to set the resistance value of the port impedances to the inputted resistance value in response to the port impedance command The testing module 16 is to determine the power parameter of the corresponding port of the S-parameter file under test in response to the testing command In the embodiment, the testing module 16 further informs the user as to the determined power parameter of the corresponding port under test. In an alternative embodiment, the testing module 16 may further determine whether the determined power parameter of the corresponding port under test is within a preset range. If it is, the testing module 16 determines that the port satisfies the requirement and informs the user accordingly. Otherwise, the testing module 16 may determine that the port does not satisfy the requirement and informs the user.

Figure 5:
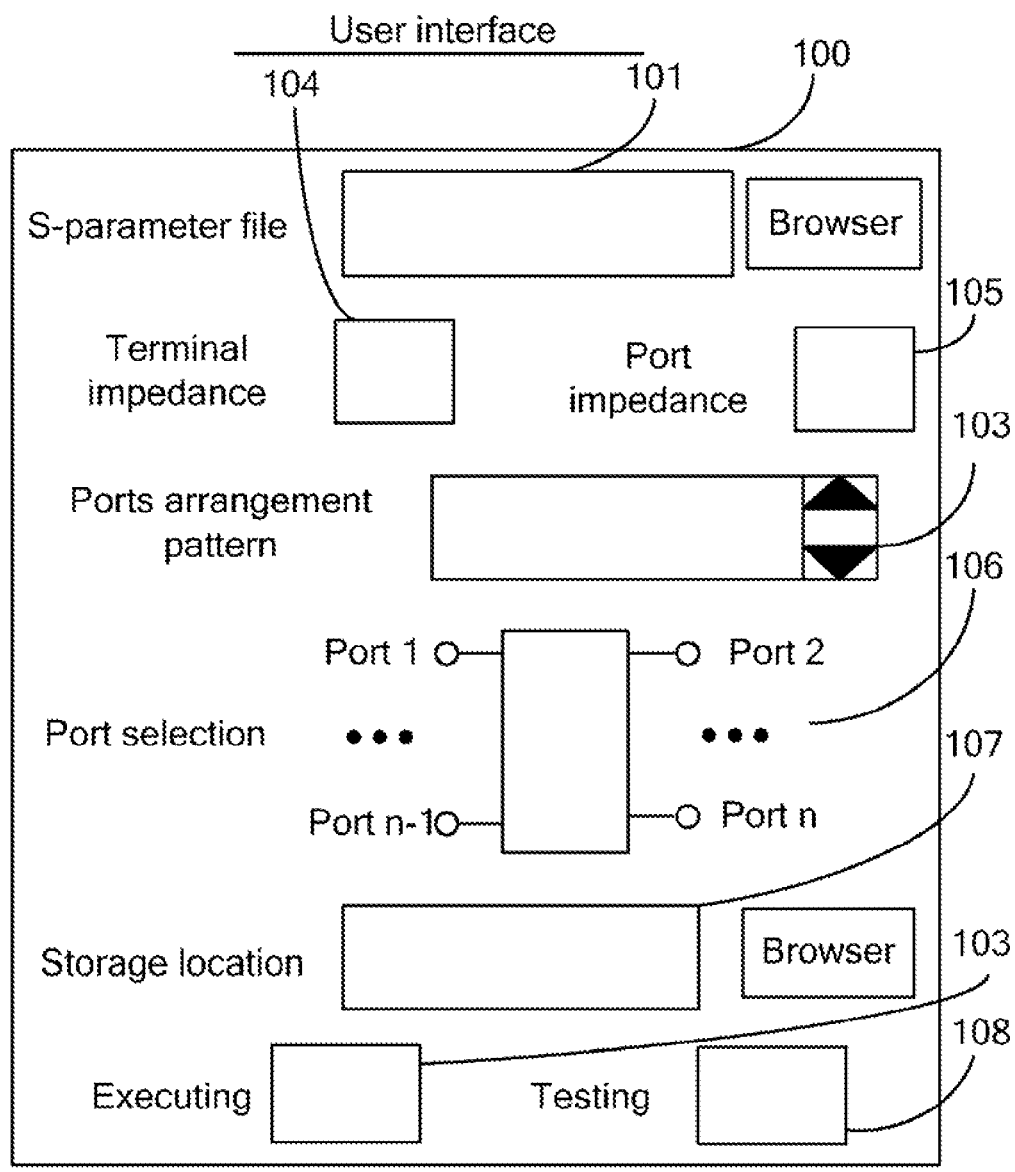
FIG. 5 is a schematic view showing a user interface.

FIG. 5 shows a schematic diagram showing the user interface 100. The user interface 100 includes an S-parameter file input box 101, a port selection box 102, and an executing input box 103.

The S-parameter file input box 101 is to provide a space for inputting the calling command The port selection box 102 is to provide a space for inputting the selecting command. The executing input box 103 is to provide a space for inputting the executing command.

In the embodiment, the user interface 100 further includes a terminal impedance input box 104, a port impedance input box 105, an arrangement pattern selection box 106, a storage location input box 107, and a testing input box 108. The terminal impedance input box 104 provides a space for inputting the terminal impedance command. The port impedance input box 105 provides a space for inputting the port impedance command. The arrangement pattern selection box 106 provides a space for inputting the ports arrangement pattern command The storage location input box 107 provides a space for inputting the storage location command. The testing input box 108 provides a space for inputting the testing command.

Figure 6:
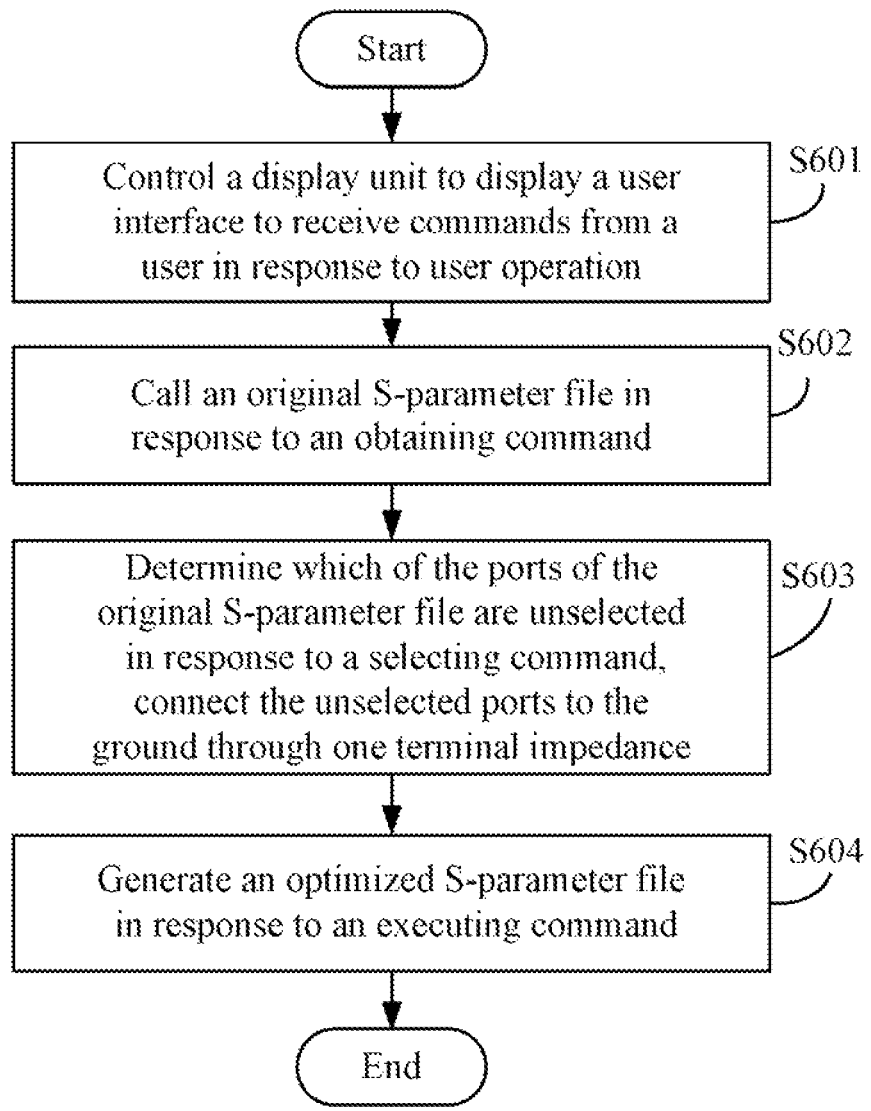
FIG. 6 is a flowchart of a port reducing method in accordance with an exemplary embodiment.

FIG. 6 shows a flow chart of a port reducing method in accordance with an exemplary embodiment.

In step S601, the display control module 11 controls the display unit to display a user interface 100 for receiving commands inputted by the user in response to a user operation.

In step S602, the obtaining module 12 obtains the original S-parameter file in response to the calling command.

In step S603, the selecting module 13 determines the ports of the original S-parameter file which have not been selected as the undesired ports in response to the selecting command, and connects each undesired port to ground through one terminal impedance.

In step S604, the executing module 14 generates an optimized S-parameter file with the undesired ports removed in response to the executing command.

In the embodiment, before the procedure of generating the optimized S-parameter file is executed, the setting module 15 further sets the resistance value of the terminal impedances to the inputted resistance value in response to the terminal impedance command.

In the embodiment, after the procedure of obtaining the original S-parameter file is executed, the setting module 15 changes the ports arrangement pattern of the original S-parameter file to the selected ports arrangement pattern in response to a ports arrangement pattern command.

In the embodiment, after the procedure of connecting each undesired port to ground through one terminal impedance is executed, the executing module 14 further determines the storage location of the optimized S-parameter file to be the target storage location in response to the storing command. After the procedure of generating the optimized S-parameter file, the executing module 14 further stores the optimized S-parameter file to the target storage location.

In the embodiment, before the procedure of determining the unselected ports, the selecting module 13 connects each selected port of the original S-parameter file to one power source through one port impedance in response to the selecting command and sets the resistance value of the port impedances to the inputted resistance value in response to the port impedance command. The testing module 16 determines the power parameter of the ports under test in response to the testing command Although the present disclosure has been specifically described on the basis of an exemplary embodiment thereof, the disclosure is not to be construed as being limited thereto. Various changes or modifications may be made to the embodiment without departing from the scope and spirit of the disclosure.

What is claimed is:

1. An electronic device comprising:
    a storage unit;
    a processor;
    a plurality of programs stored in the storage unit, executable by the processor, the programs comprising:
        a display control module operable to control a display unit to display a user interface to receive commands from a user in response to user operation, the commands comprising a calling command, a selecting command, and an executing command;
        a obtaining module operable to obtain an original S-parameter file in response to the calling command;
        a selecting module operable to determine which of the ports of the original S-parameter file are unselected in response to the selecting command, and to connect each unselected port to ground through one terminal impedance; and
        an executing module operable to generate an optimized S-parameter file that comprises only selected ports of the S-parameter file in response to the executing command.

2. The electronic device as described in claim 1, further comprising a setting module, wherein the commands further comprises a terminal impedance command, the setting module is to set the resistance value of the terminal impedances connected to the unselected ports to an inputted resistance value of the terminal impedance in response to the terminal impedance command.

3. The electronic device as described in claim 1, further comprising a setting module, wherein the commands further comprises a ports arrangement pattern command, the setting module is to change the ports arrangement pattern of the original S-parameter file to a selected ports arrangement pattern in response to the ports arrangement pattern command.

4. The electronic device as described in claim 1, wherein the commands further comprises a storing command, the executing module is to determine the storage location of the generated optimized S-parameter file to be a target storage location in response to the storing command, and further store the generated optimized S-parameter file to the target storage location in response to the executing command.

5. The electronic device as described in claim 1, further comprising a setting module and a testing module, wherein the commands further comprises a port impedance command and a testing command, the selecting module further connects each selected port of the original S-parameter file with one power source through one port impedance in response to the selecting command; the setting module further sets the resistance value of the port impedances to an inputted resistance value of the port impedance in response to the port impedance command; the testing module is to determine the power parameter of the corresponding port in response to the testing command.

6. The electronic device as described in claim 1, wherein the user interface comprises an S-parameter file input box, a port selection box, and an executing input box, the S-parameter file input box is to provide a space for inputting the calling command, the port selection input box is to provide a space for inputting the selecting command, the executing input box is to provide a space for inputting the executing command.

7. A port reducing method for removing unselected ports of an original S-parameter file and generating an optimized S-parameter file, the method comprising:
controlling a display unit to display a user interface to receive commands from a user in response to user operation, the commands comprising a calling command, a selecting command, and an executing command;
obtaining the original S-parameter file in response to the calling command;
determining which of the ports of the original S-parameter file are unselected in response to the selecting command, and connecting each unselected port to ground through one terminal impedance; and
generating the optimized S-parameter file that comprises only selected ports of the S-parameter file in response to the executing command.

8. The method as described as claim 7, wherein the commands further comprise a terminal impedance command, the method further comprises:
setting the resistance value of the terminal impedances connected to the unselected ports to an inputted resistance value of the terminal impedance in response to the terminal impedance command.

9. The method as described in claim 7, wherein the commands further comprise a ports arrangement pattern command, the method further comprises:
changing the ports arrangement pattern of the original S-parameter file to a selected ports arrangement pattern in response to the ports arrangement pattern command.

10. The method as described in claim 7, wherein the commands further comprise a storing command, the method further comprises:

determining the storage location of the generated optimized S-parameter file to be a target storage location in response to the storing command; and
storing the generated optimized S-parameter file to the target storage location in response to the executing command.

11. The method as described in claim 7, wherein the commands further comprise a port impedance command and a testing command, the method further comprises:
connecting each selected port of the original S-parameter file with one power source through one port impedance in response to the selecting command;
setting the resistance value of the port impedances to an inputted resistance value of the port impedance in response to the port impedance command; and
determining the power parameter of the corresponding port in response to the testing command.

12. A non-transitory storage medium storing a set of instructions, the set of instructions capable of being executed by a processor of an electronic device, causing the electronic device to perform a method, the method for removing unselected ports of an original S-parameter file and generating an optimized S-parameter file, the method comprising:
controlling a display unit to display a user interface to receive commands from a user in response to user operation, the commands comprising a calling command, a selecting command, and an executing command;
obtaining the original S-parameter file in response to the calling command;
determining which of the ports of the original S-parameter file are unselected in response to the selecting command, and connecting each unselected port to the ground through one terminal impedance; and
generating the optimized S-parameter file that comprises only selected ports of the S-parameter file in response to the executing command.

13. The non-transitory storage medium as described in claim 12, wherein the commands further comprise a terminal impedance command, the method further comprises:
setting the resistance value of the terminal impedances connected to the unselected ports to an inputted resistance value of the terminal impedance in response to the terminal impedance command.

14. The non-transitory storage medium as described in claim 12, wherein the commands further comprise a ports arrangement pattern command, the method further comprises:
changing the ports arrangement pattern of the original S-parameter file to a selected ports arrangement pattern in response to the ports arrangement pattern command.

15. The non-transitory storage medium as described in claim 12, wherein the commands further comprise a storing command, the method further comprises:
determining the storage location of the generated optimized S-parameter file to be a target storage location in response to the storing command; and
storing the generated optimized S-parameter file to the target storage location in response to the executing command.

16. The non-transitory storage medium as described in claim 12, wherein the commands further comprise a port impedance command and a testing command, the method further comprises:
connecting each selected port of the original S-parameter file with one power source through one port impedance in response to the selecting command;

setting the resistance value of the port impedances to an inputted resistance value of the port impedance in response to the port impedance command; and determining the power parameter of the corresponding port in response to the testing command.

\* \* \* \* \*